United States Patent
Mo et al.

(10) Patent No.: US 9,268,161 B2
(45) Date of Patent: Feb. 23, 2016

(54) METHOD FOR MANUFACTURING A LIQUID CRYSTAL PANEL

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Zailong Mo, Beijing (CN); Tianlei Shi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 242 days.

(21) Appl. No.: 14/104,798

(22) Filed: Dec. 12, 2013

(65) Prior Publication Data

US 2014/0170924 A1    Jun. 19, 2014

(30) Foreign Application Priority Data

Dec. 13, 2012 (CN) .......................... 2012 1 0540816

(51) Int. Cl.
| | |
|---|---|
| B29C 65/52 | (2006.01) |
| B32B 37/12 | (2006.01) |
| B32B 37/18 | (2006.01) |
| B32B 38/10 | (2006.01) |
| B32B 43/00 | (2006.01) |
| C08J 5/12 | (2006.01) |
| C09J 5/02 | (2006.01) |
| G02F 1/1333 | (2006.01) |
| G02F 1/13 | (2006.01) |
| H01L 27/12 | (2006.01) |

(52) U.S. Cl.
CPC ............ *G02F 1/1333* (2013.01); *G02F 1/1303* (2013.01); *H01L 27/1266* (2013.01); *G02F 2001/133302* (2013.01); *G02F 2202/28* (2013.01); *G02F 2203/68* (2013.01)

(58) Field of Classification Search
USPC ........... 156/249, 278, 307.1, 307.3, 701, 716, 156/717
See application file for complete search history.

(56) References Cited

U.S. PATENT DOCUMENTS

| | | | | |
|---|---|---|---|---|
| 5,312,256 | A * | 5/1994 | Scortecci | A61C 8/0022 433/173 |
| 5,766,053 | A * | 6/1998 | Cathey | H01J 29/90 313/497 |
| 5,786,232 | A * | 7/1998 | Stansbury | H01J 9/185 438/125 |
| 5,897,341 | A * | 4/1999 | Love | H01L 24/81 257/E21.511 |
| 6,104,135 | A * | 8/2000 | Stansbury | H01J 9/185 313/495 |
| 6,142,358 | A * | 11/2000 | Cohn | B23K 1/0016 228/120 |

(Continued)

OTHER PUBLICATIONS

Extended European Search Report Issued Apr. 17, 2014 Appln. No. EP 13 19 7083.

*Primary Examiner* — Sing P Chan
(74) *Attorney, Agent, or Firm* — Ladas & Parry LLP

(57) ABSTRACT

A method for manufacturing a liquid crystal panel is provided. The method comprises bonding a first substrate with a second substrate so as to form a mother substrate; forming an array pattern on a first substrate side of the mother substrate, the first substrate side being away from the second substrate; separating the first substrate and the second substrate of the mother substrate; and bonding the separated first substrate and the second substrate so that the array pattern is located between the first and second substrates.

15 Claims, 5 Drawing Sheets

(56) References Cited

U.S. PATENT DOCUMENTS

| | | | | |
|---|---|---|---|---|
| 6,297,869 B1* | 10/2001 | Choo | G02F 1/133351 | 349/187 |
| 6,310,667 B1* | 10/2001 | Nakayoshi | G02F 1/1345 | 257/72 |
| 6,316,786 B1* | 11/2001 | Mueller | H01L 25/046 | 257/40 |
| 6,432,741 B1* | 8/2002 | Mueller | H01L 25/046 | 257/E25.008 |
| 6,574,044 B1* | 6/2003 | Sahouani | G02B 5/3025 | 349/1 |
| 6,577,913 B2* | 6/2003 | Byun | G05B 19/4183 | 700/116 |
| 6,580,489 B2* | 6/2003 | Choo | G02F 1/133351 | 349/187 |
| 6,768,586 B2* | 7/2004 | Sahouani | G02B 5/3025 | 349/194 |
| 6,782,928 B2* | 8/2004 | Kweon | B05C 5/0225 | 141/192 |
| 6,784,962 B2* | 8/2004 | Sumida | G02F 1/1335 | 349/112 |
| 6,801,293 B1* | 10/2004 | Nishiyama | G02F 1/133512 | 349/141 |
| 6,822,725 B2* | 11/2004 | Choo | G02F 1/133351 | 349/153 |
| 7,022,199 B2* | 4/2006 | Lee | G02F 1/1341 | 156/106 |
| 7,038,751 B2* | 5/2006 | Lee | G02F 1/1339 | 349/139 |
| 7,074,103 B2* | 7/2006 | Yamada | H01L 51/5237 | 257/E23.193 |
| 7,084,045 B2* | 8/2006 | Takayama | H01L 21/2007 | 257/E21.122 |
| 7,096,897 B2* | 8/2006 | Kweon | B05C 5/0225 | 141/192 |
| 7,102,726 B2* | 9/2006 | Byun | G02F 13/03 | 349/189 |
| 7,103,443 B2* | 9/2006 | Strang | H01L 21/67017 | 118/716 |
| 7,230,670 B2* | 6/2007 | Lee | G02F 1/1341 | 349/153 |
| 7,230,671 B2* | 6/2007 | Lee | G02F 1/1341 | 349/187 |
| 7,244,476 B2* | 7/2007 | Sumida | G02F 1/1335 | 349/122 |
| 7,306,016 B2* | 12/2007 | Kweon | B05C 5/0225 | 141/1 |
| 7,332,726 B2* | 2/2008 | Friedman | C22C 19/05 | 250/374 |
| 7,341,924 B2* | 3/2008 | Takayama | H01L 21/2007 | 257/E21.122 |
| 7,349,050 B2* | 3/2008 | Park | G02F 1/1339 | 349/124 |
| 7,351,602 B2* | 4/2008 | Dong | G01R 1/07314 | 257/E29.273 |
| 7,354,809 B2* | 4/2008 | Yuan | H01L 21/84 | 257/E21.415 |
| 7,363,188 B1* | 4/2008 | Olgaard | G01R 31/31707 | 702/118 |
| 7,388,388 B2* | 6/2008 | Dong | G01R 1/07314 | 324/754.07 |
| 7,436,483 B2* | 10/2008 | Byun | G02F 1/1303 | 349/187 |
| 7,518,119 B2* | 4/2009 | Friedman | C22C 19/05 | 250/374 |
| 7,616,288 B2* | 11/2009 | Motomatsu | G02F 1/13392 | 349/123 |
| 7,626,749 B2* | 12/2009 | Baur | B32B 17/10174 | 359/265 |
| 7,696,485 B2* | 4/2010 | Friedman | C22C 19/05 | 250/382 |
| 7,731,059 B2* | 6/2010 | Kweon | B05C 5/0225 | 222/399 |
| 7,745,741 B2* | 6/2010 | Kweon | B05C 5/0225 | 141/83 |
| 7,759,220 B2* | 7/2010 | Henley | H01L 31/18 | 257/E21.48 |
| 7,812,353 B2* | 10/2010 | Yuan | H01L 21/84 | 257/351 |
| 7,859,738 B2* | 12/2010 | Baur | B32B 17/10174 | 359/265 |
| 7,982,191 B2* | 7/2011 | Friedman | C22C 19/05 | 250/374 |
| 8,089,073 B2* | 1/2012 | Evans | H01L 21/84 | 257/74 |
| 8,191,750 B2* | 6/2012 | Park | C03B 33/033 | 225/2 |
| 8,254,011 B2* | 8/2012 | Baur | B32B 17/10174 | 359/265 |
| 8,389,946 B2* | 3/2013 | Friedman | G01T 1/185 | 250/382 |
| 8,503,062 B2* | 8/2013 | Baur | B32B 17/10174 | 359/265 |
| 8,585,455 B1* | 11/2013 | Cok | G06F 3/0412 | 313/503 |
| 8,591,279 B1* | 11/2013 | Cok | H05K 9/0096 | 313/582 |
| 8,654,433 B2* | 2/2014 | Baur | | 359/265 |
| 8,865,298 B2* | 10/2014 | Majumdar | H01L 51/0024 | 428/202 |
| 8,934,259 B2* | 1/2015 | Bower | H01L 21/563 | 257/782 |
| 8,985,810 B2* | 3/2015 | Woodgate | F21K 9/135 | 362/249.02 |
| 8,987,606 B2* | 3/2015 | Wong | H05K 1/095 | 156/272.2 |
| 2002/0020924 A1* | 2/2002 | Mueller | H01L 25/046 | 257/778 |
| 2002/0027629 A1* | 3/2002 | Choo | G02F 1/133351 | 349/122 |
| 2002/0057413 A1* | 5/2002 | Sumida | G02F 1/1335 | 349/187 |
| 2002/0173871 A1* | 11/2002 | Byun | G05B 19/4183 | 700/121 |
| 2003/0067579 A1* | 4/2003 | Inoue | G02F 1/133788 | 349/187 |
| 2003/0067581 A1* | 4/2003 | Lee | G02F 1/1341 | 349/187 |
| 2003/0145944 A1* | 8/2003 | Lee | G02F 1/1341 | 156/285 |
| 2003/0147032 A1* | 8/2003 | Park | G02F 1/1339 | 349/124 |
| 2003/0147039 A1* | 8/2003 | Lee | G02F 1/1339 | 349/187 |
| 2003/0148117 A1* | 8/2003 | Takada | B29C 45/0001 | 428/447 |
| 2003/0172988 A1* | 9/2003 | Kweon | B05C 5/0225 | 141/192 |
| 2003/0184862 A1* | 10/2003 | Sahouani | G02B 5/3025 | 359/487.02 |
| 2003/0206266 A1* | 11/2003 | Choo | G02F 1/133351 | 349/187 |
| 2003/0223030 A1* | 12/2003 | Byun | G02F 1/1303 | 349/187 |
| 2004/0166597 A1* | 8/2004 | Strang | H01L 21/67017 | 438/5 |
| 2004/0246580 A1* | 12/2004 | Sahouani | G02B 5/3025 | 359/487.02 |
| 2004/0252270 A1* | 12/2004 | Lee | G02F 1/1339 | 349/153 |
| 2004/0256025 A1* | 12/2004 | Kweon | B05C 5/0225 | 141/192 |
| 2004/0259455 A1* | 12/2004 | Yamada | H01L 51/5237 | 445/25 |
| 2005/0000983 A1* | 1/2005 | Kweon | B05C 5/0225 | 222/55 |
| 2005/0003108 A1* | 1/2005 | Sumida | G02F 1/1335 | 428/1.1 |
| 2005/0022938 A1* | 2/2005 | Masuda | B23H 5/08 | 156/580 |
| 2005/0061123 A1* | 3/2005 | Park | C03B 33/033 | 83/13 |
| 2005/0088610 A1* | 4/2005 | Choo | G02F 1/133351 | 349/187 |

(56) References Cited

U.S. PATENT DOCUMENTS

| | | | |
|---|---|---|---|
| 2005/0130391 A1* | 6/2005 | Takayama | H01L 21/2007 438/458 |
| 2005/0157246 A1* | 7/2005 | Motomatsu | G02F 1/13392 349/187 |
| 2005/0248715 A1* | 11/2005 | Byun | G02F 1/1303 349/187 |
| 2006/0049362 A1* | 3/2006 | Friedman | C22C 19/05 250/374 |
| 2006/0098155 A1* | 5/2006 | Choo | G02F 1/133351 349/187 |
| 2006/0145338 A1* | 7/2006 | Dong | G01R 1/07314 257/723 |
| 2006/0231527 A1* | 10/2006 | Takayama | H01L 21/2007 216/62 |
| 2006/0272734 A1* | 12/2006 | Kweon | B05C 5/0225 222/394 |
| 2007/0187719 A1* | 8/2007 | Yuan | H01L 21/84 257/202 |
| 2008/0083787 A1* | 4/2008 | Kweon | B05C 5/0225 222/192 |
| 2008/0121809 A1* | 5/2008 | Friedman | C22C 19/05 250/382 |
| 2008/0160661 A1* | 7/2008 | Henley | H01L 31/18 438/68 |
| 2008/0212189 A1* | 9/2008 | Baur | B32B 17/10174 359/604 |
| 2008/0296756 A1* | 12/2008 | Koch | H01L 21/4882 257/713 |
| 2008/0315253 A1* | 12/2008 | Yuan | H01L 21/84 257/190 |
| 2009/0080055 A1* | 3/2009 | Baur | B32B 17/10174 359/267 |
| 2009/0206267 A1* | 8/2009 | Friedman | C22C 19/05 250/374 |
| 2010/0066519 A1* | 3/2010 | Baur | B32B 17/10174 340/435 |
| 2010/0109220 A1* | 5/2010 | Musha | B65G 49/061 269/7 |
| 2010/0187431 A1* | 7/2010 | Friedman | C22C 19/05 250/375 |
| 2010/0327355 A1* | 12/2010 | Yuan | H01L 21/84 257/347 |
| 2011/0038150 A1* | 2/2011 | Woodgate | F21K 9/135 362/235 |
| 2011/0102167 A1* | 5/2011 | Baur | B32B 17/10174 340/439 |
| 2011/0182056 A1* | 7/2011 | Trottier | H01L 33/507 362/84 |
| 2011/0186887 A1* | 8/2011 | Trottier | H01L 33/50 257/98 |
| 2011/0215348 A1* | 9/2011 | Trottier | H01L 33/60 257/89 |
| 2011/0309261 A1* | 12/2011 | Friedman | G01T 1/185 250/382 |
| 2011/0317397 A1* | 12/2011 | Trottier | H01L 33/502 362/84 |
| 2012/0235969 A1* | 9/2012 | Burns | B81C 1/00095 345/211 |
| 2012/0314388 A1* | 12/2012 | Bower | H01L 21/563 361/760 |
| 2012/0320444 A1* | 12/2012 | Baur | B32B 17/10174 359/267 |
| 2013/0004753 A1* | 1/2013 | Majumdar | H01L 51/0024 428/209 |
| 2013/0134396 A1* | 5/2013 | Shimomura | H01L 51/5012 257/40 |
| 2013/0235285 A1* | 9/2013 | Rowe | G02F 1/13338 349/12 |
| 2013/0240748 A1* | 9/2013 | Friedman | G01T 1/185 250/375 |
| 2013/0314760 A1* | 11/2013 | Baur | B32B 17/10174 359/267 |
| 2013/0337615 A1* | 12/2013 | Xu | H01L 21/02112 438/125 |
| 2014/0192520 A1* | 7/2014 | Baur | B32B 17/10174 362/135 |
| 2014/0332148 A1* | 11/2014 | Majumdar | H01L 51/0024 156/240 |
| 2014/0333873 A1* | 11/2014 | Hyung | G02F 1/133606 349/64 |
| 2015/0212609 A1* | 7/2015 | Tung | B05D 1/36 345/174 |
| 2015/0219972 A1* | 8/2015 | Yang | G02F 1/136209 349/43 |

* cited by examiner

METHOD FOR MANUFACTURING A LIQUID CRYSTAL PANEL

FIELD OF THE INVENTION

Embodiments of the present invention relate to a method for manufacturing a liquid crystal panel.

BACKGROUND

The display principle of a thin film transistor liquid crystal display (TFT-LCD) is as follows. Thin film transistors (TFTs) are used to control arrangement of liquid crystal molecules between two glass substrates by producing and controlling voltage. The liquid crystal material is capable of generating gray scale due to its photoelectric property. With the aid of the color filter (CF), a full range of colors can be displayed.

The liquid crystal panel of a TFT-LCD mainly comprises an array substrate, a color filter substrate, and a liquid crystal layer disposed therebetween, wherein a spacer is provided to maintain a predetermined space, and a seal is applied to form a liquid crystal cell.

Wide application of TFT-LCD in mobile devices has created an increasingly high demand for much thinner and lighter LCD screen. However, bending tends to occur in a glass substrate by its own gravity, and the extent of its bending is inversely proportional to its own thickness. Therefore, the thinner the glass substrate is, the greater the bending amount will be. If excessive bending occurs, the glass substrate may be cracked or broken, and as a result, patterns on the glass substrate may be distorted accordingly. At present, in mainstream process for a TFT-LCD, glass substrates with a thickness of 0.5 mm~1.0 mm are used to manufacture the array substrate and the color filter substrate, hence producing a liquid crystal cell with a thickness of 1.0-2.0 mm.

To facilitate the application of TFT-LCD in mobile devices, liquid crystal cell substrates manufactured by LCD factories usually need to be subjected to a thinning process, for example, through hydrofluoric acid etching or mechanical polishing, so as to reduce the cell thickness from 1.0~2.0 mm to 0.5~0.6 mm. However, cleanliness requirement in a thinning process is far less than in a LCD manufacturing process, thus resulting in some product appearance defects, such as, scratches, protrusions and stains. On the other hand, the thinning process also adds the cost for manufacturing a LCD. Besides, waste water from the thinning process may bring serious environmental pollution.

SUMMARY

An embodiment of the present invention provides a method for manufacturing a liquid crystal panel. comprising the followings steps: bonding a first substrate with a second substrate so as to form a mother substrate; forming an array pattern on a first substrate side of the mother substrate, the first substrate side being away from the second substrate; separating the first substrate and the second substrate of the mother substrate; and bonding the separated first substrate and the second substrate so that the array pattern is located between the first and second substrates.

In an example, after the step of forming the array pattern on the first substrate side of the mother substrate and before the step of separating the first substrate and the second substrate of the mother substrate, the method further comprises: forming a color filter pattern on the first substrate side or a second substrate side of the mother substrate, the second substrate side being away from the first substrate; and bonding the separated first and second substrates in such a way that the color filter pattern and the array pattern are located between the first and second substrates.

In an example, after the step of forming the array pattern on the first substrate side of the mother substrate, the mother substrate is flipped so as to form the color filter pattern on the second substrate side of the mother substrate.

In an example, the first and second substrates are bonded together with an adhesive applied on the periphery of any one of the first and second substrates.

In an example, the adhesive does not contain any fiber-particle.

In an example, before the step of separating the first and second substrates of the mother substrate, the method further comprises: forming a first alignment layer and a second alignment layer on the first substrate side and the second substrate side of the mother substrate respectively; and rubbing both the first and the second alignment layers.

In an example, the step of bonding the separated first substrate and the second substrate comprises applying a seal onto the second substrate side of the mother substrate formed with the rubbed second alignment film; flipping the mother substrate; and dropping liquid crystal onto the first substrate side of the mother substrate formed with the rubbed first alignment film.

In an example, the color filter pattern on the second substrate side of the mother substrate is cleaned in a non-contact way.

In an example, after the step of separating the first substrate and the second substrate of the mother substrate, the method further comprises transferring the separated first substrate and/or the second substrate in an overall support way.

In an example, the mother substrate is flipped in an overall support way.

In an example, the separated first substrate and/or the second substrate are/is supported at a non-effective display portion thereof.

In an example, the mother substrate is supported at a non-effective display portion thereof.

In an example, the first and second substrates of the mother substrate are separated by an adsorption separation process.

In an example, the liquid crystal panel has a thickness of no more than 0.5 mm.

In an example, at least one of the first and second substrates has a thickness of no more than 0.25 mm.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 1b is a schematic diagram of a mother substrate constituted by the ultra-thin glass substrate shown in FIG. 1a.

DETAILED DESCRIPTION OF EMBODIMENTS

Figure 1A:
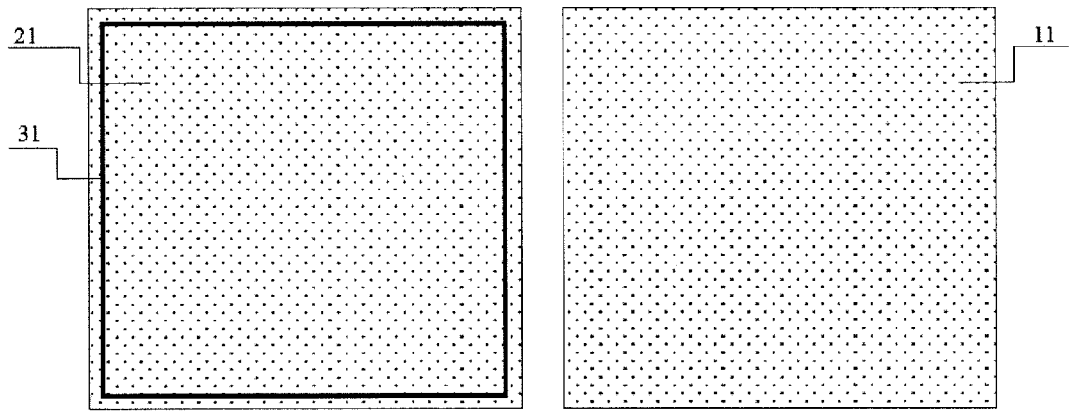
FIG. 1a is a schematic diagram of an ultra-thin glass substrate used in an embodiment of the present invention.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art may obtain other embodiment(s), without any inventive work, which should be within the scope of the invention. In the full text of this article, the like reference numeral refers to the like component.

The terms "top" and "bottom," "upper" and "lower" and "above" and "beneath" as may be used herein are by way of example and illustrative purposes only, and are not meant to limit the description of the invention inasmuch as the referenced item can be exchanged in position and orientation. When a first item is referred to as being "on" a second item, it could mean that the first item is formed directly on the second item, or it could also mean that a third item may exist between the first item and the second item.

An embodiment of the present invention provides a method for manufacturing a liquid crystal panel, comprising the following steps: press bonding a first substrate (for example, a first glass substrate) with a second substrate (for example, a second glass substrate) so as to form a mother substrate; forming an array pattern on the first substrate of the mother substrate so that the first substrate and the array pattern thereon form an array substrate; flipping the mother substrate provided with the array pattern; forming a color filter pattern on the second substrate of the mother substrate so that the second substrate and the color filter pattern thereon form a color filter substrate; cutting the mother substrate thus foamed so as to separate the array substrate and the color filter substrate; flipping the separated array substrate and color filter substrate so that the array pattern and the color filter pattern are located between the first and second substrates; and bonding the array substrate and the color filter substrate together.

Before cutting the mother substrate, two alignment layers can be separately faulted on the side of the first substrate facing away from the second substrate and the side of the second substrate facing away from the first substrate, and both these alignment layers are subjected to rubbing process. A seal is applied onto the second substrate with the rubbed second alignment layer, the mother substrate then is flipped, and liquid crystal is dropped onto of the first substrate the rubbed first alignment layer.

According to the method of the above described embodiment of the present invention, it is possible to manufacture an ultra-thin liquid crystal panel (for example, a panel having a thickness of less than 0.5 mm), without any subsequent thinning process.

Below, the method for manufacturing a liquid crystal panel according to an embodiment of the present invention will be specifically described in connection with FIG. 1a to FIG. 7.

Figure 1B:
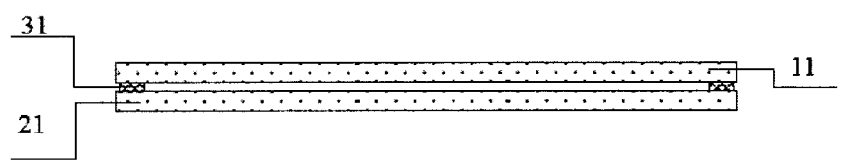

As shown in FIG. 1a and FIG. 1b, an adhesive 31 is applied along the peripheral of a first glass substrate 11 having a thickness of for example, about 0.25 mm. The first glass substrate 11 can be used to form an array substrate or a color filter substrate. In the following description, the first glass substrate is, as an example, used to form an array substrate. Herein, the application of the adhesive can be similar to the application of a glass dummy seal during an existing cell formation process. After that, a second glass substrate 21 having a thickness of, for example, about 0.25 mm, is bonded with the first glass substrate 11 by the adhesive, and the adhesive is cured at a high temperature. In this way, a mother substrate having a thickness of about 0.5 mm is formed, as shown in FIG. 1b.

In consideration of possible deterioration of the stickiness of the adhesive under a high temperature condition in the subsequent process, the adhesive in accordance with the embodiment is for example a high temperature thermally curable adhesive, so as to prevent separation of the two glass substrates, or a plump glass substrate due to entrance of outside air.

The coating width of the adhesive 31 can be 1.0~1.5 mm. The coating width may have a fluctuation of 0.2 mm relative to an average value. With the adhesive of such a coating width, a firm adhesion of the two glass substrates can be ensured. The distance between the edge of the adhesive 31 and the corresponding edge of the glass substrates can be 0.25 mm. that is, the coating region of the peripheral adhesive 31 of the mother substrate can have a widths of 1.45~1.95 mm, for example. A process error width area apart from the edge of the glass substrates by approximately 10 mm is generally needed in the subsequent film-forming and etching processes for forming an array pattern and a color filter pattern. Therefore, the coating width and position of the peripheral adhesive 31 will not reduce the utilization rate of the glass substrates.

The press bonding process and the thermal curing process described above are similar to the existing cell formation process, that is, two glass substrates are aligned with each other and press bonded in a vacuum state. This vacuum press bonding process will not affect the performance of the frame adhesive 31. After the press bonding process, the adhesive 31 applied along the periphery of the mother substrate can effectively prevent outside air from entering the space between the two glass substrates. To ensure accurate adherence of the two glass substrates, an elementary mechanical alignment device and an optical sensor can be used during the press bonding process.

After the two glass substrates are bonded together to form the mother substrate, a vacuum empty box may appear, near the location of the adhesive 31. To prevent the empty box from affecting the subsequent process, the adhesive 31 used in the embodiment of the present invention does not contain any additional fiber particle, so as to ensure that the maximum thickness of the vacuum empty box between the two glass substrates of the mother substrate is less than 1 um, hence not affecting subsequent processes.

Figure 2:
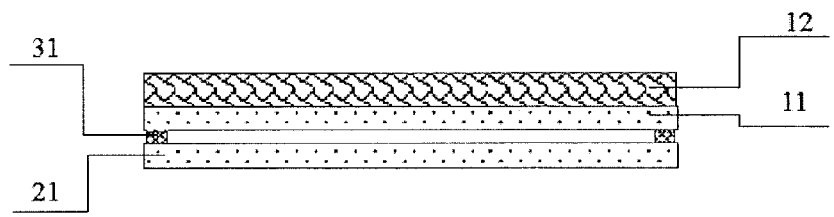
FIG. 2 is a schematic diagram showing the resulting structure after an array pattern is formed onto the mother substrate in accordance with an embodiment of the present invention.

As shown in FIG. 2, the array pattern 12 is formed above the first glass substrate 11 of the mother substrate. The formation of the array pattern 12 for example includes the following steps: forming a gate pattern; forming a source/drain pattern and an active layer pattern; forming a through-hole pattern; forming a pixel electrode pattern.

The above steps for forming an array pattern 12 are described by taking a bottom-gate structure as an example. However, the formation sequence of those patterns described above can be altered, as long as necessary elements for driving the liquid crystal panel (such as gate, source, drain, and pixel electrode) are formed to ensure a normal drive of the liquid crystal panel. For instance, the conductive layers are insulated from each other, and electrically conducive components used to connect to the outside (such as, electrode made of ITO material) are formed.

In an embodiment of the present invention, the mother substrate need not to be flipped, so that a color filter pattern 22 can be directly formed on the bottom of the second glass substrate 21.

Figure 3:
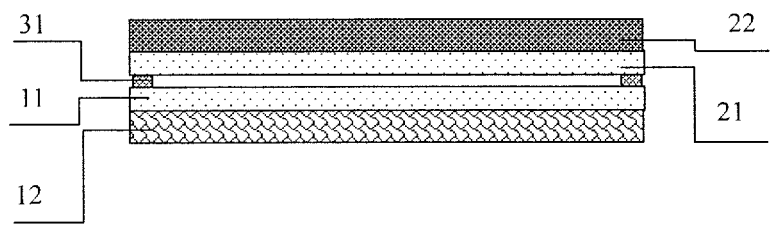
FIG. 3 is a schematic diagram showing the resulting structure after a color filter pattern is formed on the mother substrate in accordance with an embodiment of the present invention.

As shown in FIG. 3, the mother substrate provided with the array pattern 12 can be flipped so that the first glass substrate 11 provided with the array pattern is located right beneath the blank second glass substrate 21, hence avoiding increasing process complexity.

The formation of the color filter pattern 22 on the second glass substrate 21, for example, comprises the following steps: forming a black matrix pattern; forming a pixel pattern of any one or two or three or four of four pixels (i.e., red pixel, green pixel, blue and white pixel; forming an ITO common electrode; and forming a spacer pattern.

Figure 4:
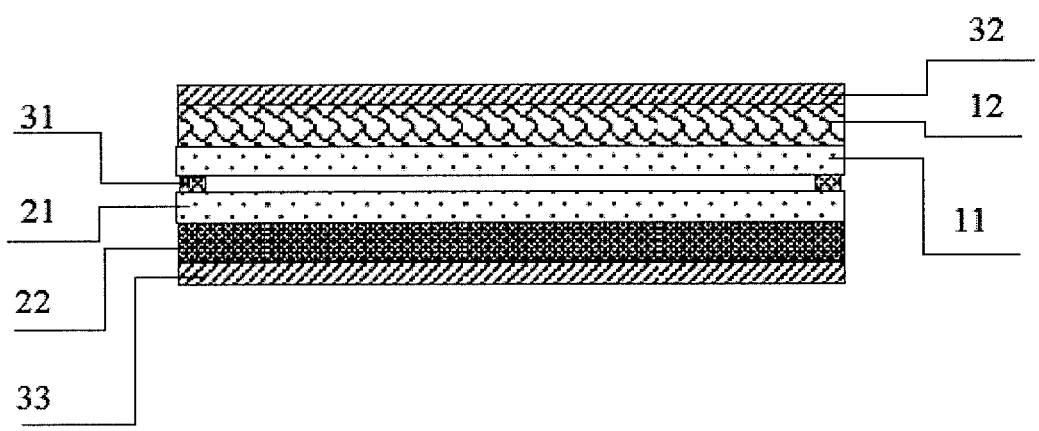
FIG. 4 is a schematic diagram showing the resulting structure after a first alignment layer and a second alignment layer are respectively formed at two sides of the structure shown in FIG. 3 and both the first and second alignment layers are subjected to rubbing process.

As shown in FIG. 4, an alignment process is performed to the mother substrate provided with the array pattern 12 and the color filter pattern 22. The alignment process for example comprises the following steps: coating the array pattern 12 with a first alignment layer 32 and curing the first alignment layer 32; rubbing the first alignment layer 32; coating the array pattern 22 with a second alignment layer 33 and curing the second alignment layer 33; and rubbing the second alignment layer. In this way, the rubbed first alignment layer 32 and the rubbed second alignment 33 are formed respectively on the two sides of the mother substrate.

The above-described alignment process can be performed by using an existing alignment process. For example, the above-described alignment process can be performed by using a non-contact alignment process such as a photo alignment process, so as to avoid damaging the array pattern and the color filter pattern.

Figure 5:
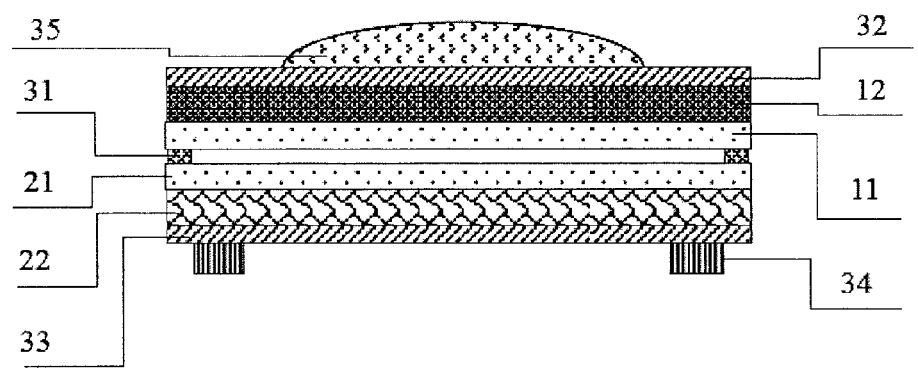
FIG. 5 is a schematic diagram showing the resulting structure after application of a seal at one side of the structure shown in FIG. 4 and dropping of liquid crystal material at the other side of the structure shown in FIG. 4.

After the alignment process, the following processes can be performed. As shown in FIG. 5, a seal 34 is dispensed onto the second alignment layer 33; liquid crystals 35 are dropped onto the first alignment layer 32; and the first and second glass substrates of the mother substrate are separated.

Figure 6:
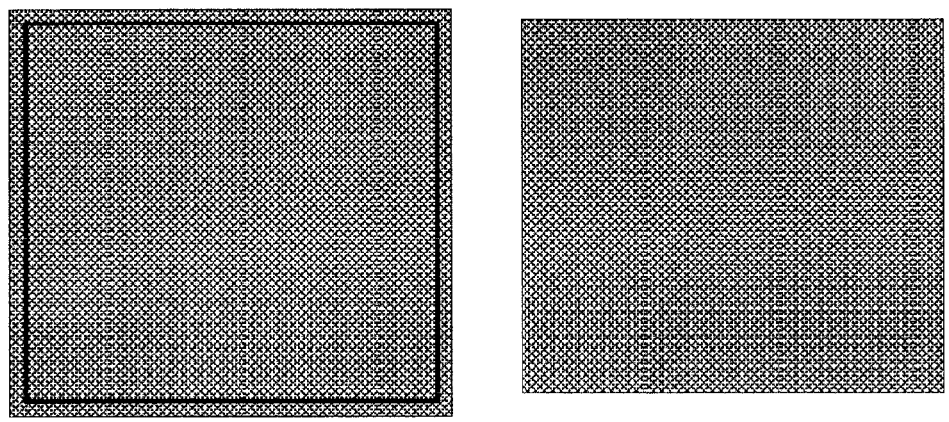
FIG. 6 is a schematic diagram showing a cutting process applied to the mother substrate in accordance with an embodiment of the present invention.

The first and second glass substrates of the mother substrate are separated for example by cutting off the adhesive coating part of the mother substrate, as shown in FIG. 6. For example, a cutter wheel dicing cutting process can be adopted. Non-contact cutting process such as laser cutting can also be used. After removing the adhesive coating part of the mother substrate on which the adhesive 31 coated, the vacuum state within the mother substrate is released, and the array substrate and the color filter substrate are separated from each other in an inert nitrogen atmosphere by using a sorption arm. Since only the blank margin area of the mother substrate is removed during the cutting process described above, the seal and liquid crystal material for a liquid crystal cell on the substrate are not affected.

Figure 7:
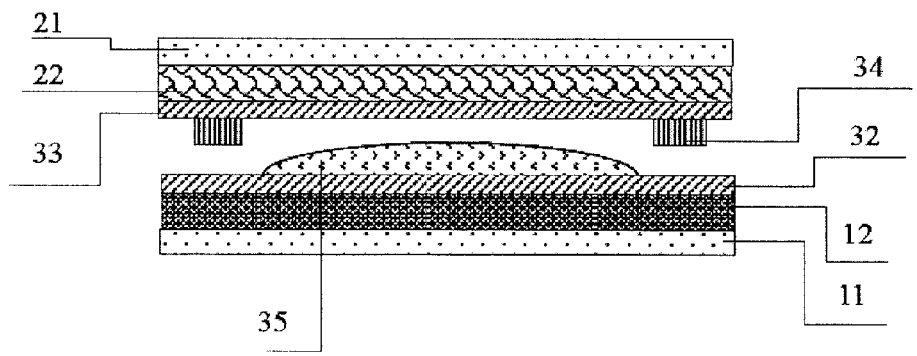
FIG. 7 is a schematic diagram showing the assembling process under vacuum for bonding the array substrate and the color filter substrate in accordance with an embodiment of the present invention.

As shown in FIG. 7, after being separated, the array substrate and the color film substrate are transferred into a vacuum bonding machine. In the vacuum bonding machine, the array substrate is located above the color filter substrate and bonded with the color filter substrate so as to form a cell; then, ultra-thin TFT-LCD products can be formed after seal curing and scribing processes.

To avoid scratches on the array pattern and the color filter pattern, components which may bring damages or scratches to these substrates, such as brush components of a cleaning device, can be avoided. Therefore, in the method according to an embodiment of the present invention, the cleaning is performed by a non-contact cleaning process such as water-air mixed cleaning and ultrasonic cleaning, instead of using a roller brush.

According to an embodiment of the present invention, during the manufacturing of a TFT-LCD, when the glass substrates are flipped or transferred, the support points or sorption points of a machine are attached to the glass substrates at locations away from the effective display region so as to avoid the distortion and breaking of the glass substrates and damage to the array pattern and the color filter pattern. In other words, the support points or sorption points of the machine can be applied to locate outside of the display region of the liquid crystal cell where is covered by an insulating layer. Therefore, damages caused by the support points or sorption points can be minimized.

The adjustment of the distribution of the support points and sorption points mainly relates to the modification of the mechanical arm and the flipping device.

Figure 8A:
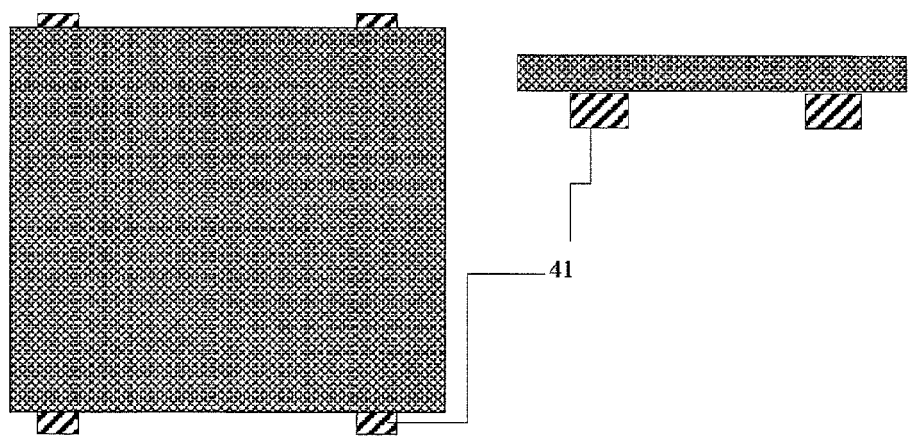
FIG. 8a is a schematic diagram showing a modification of the support parts of mechanical arms in accordance with an embodiment of the present invention.
Figure 8B:
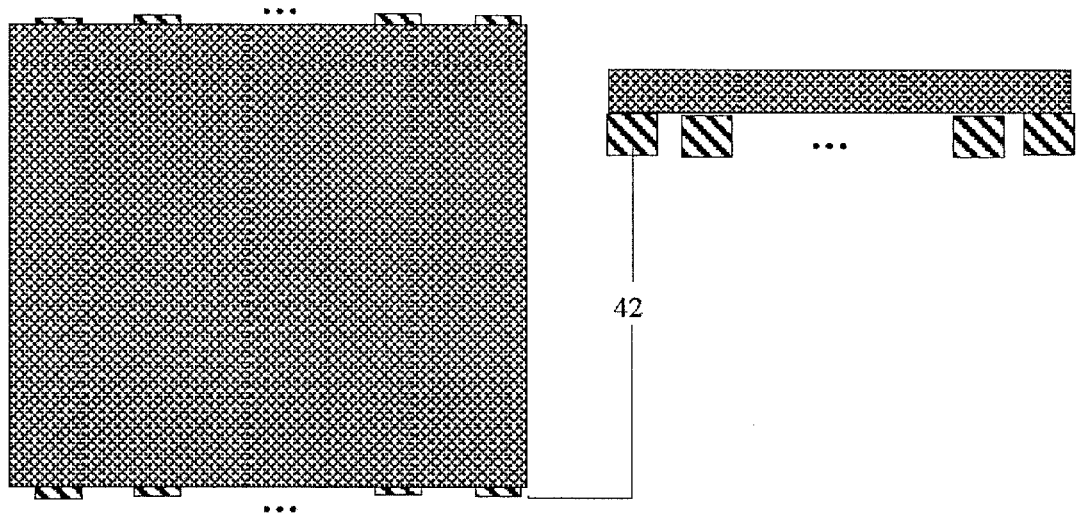
FIG. 8b is a schematic diagram showing a modification of a flip device in accordance with an embodiment of the present invention.

As shown in 8a, the primary mechanical arm has two support/sorption points 41, which can not provide sufficient support/sorption at the central part of the glass substrate, thus likely leading to a bent or broken glass substrate. To solve this problem, in accordance with an embodiment of the present invention, the mechanical arm is improved to be a mechanical tray, that is, an overall supporting structure, as shown in FIG. 8b, so as to ensure that the whole glass substrate is given sufficient support and avoid the breaking of the glass substrate due to excessive thinness. It should be noted that the supporting/sorption points of the mechanical arm need to be attached to the substrate at outside of the effective display region, and an increased number of support/sorption points 42 of the mechanical arm are distributed more densely so as to more firmly support the substrate. Therefore, with a great number of support/sorption points of the mechanical arm to be located outside the effective display region, the ultra-thin glass substrate having a thickness of, for example, 0.25 mm, can be safely transferred.

The modification of the flipping device used for flipping the glass substrate is similar to the modification of the mechanical arm.

Besides, since the liquid crystal cell formed by bonding two glass substrates can have a thickness of about 0.5 mm, the existing cutting device, sorption separation device, and flipping device can also be adopted, only by changing some of the corresponding parameters.

It is understandable from the above detailed explanation that the method for manufacturing an ultra-thin TFT-LCD in accordance with embodiments of the present invention can also adopt the existing devices. To further avoid damages to the ultra-thin glass substrates during transferring and flipping processes, the locations of the sorption points and support points of the mechanical arm and the flipping device are accordingly adjusted.

Although the array pattern and the color filter pattern are respectively located on two different glass substrates in the above embodiments of the present invention, the method for manufacturing a liquid crystal panel in accordance with embodiments of the present invention is not limited to the liquid crystal panel described above. In fact, the method for manufacturing a liquid crystal panel in accordance with embodiments of the present invention can also be used to manufacture a COA liquid crystal panel, wherein the color filter pattern and the array pattern are formed on the same substrate.

In the method for manufacturing a liquid crystal panel in accordance with embodiments of the present invention, since thinner glass substrates are originally used to form an array substrate and a counter substrate, thus avoiding a sequent thinning process to the glass substrates. Therefore, the manufacturing cost is effectively reduced, the manufacturing process is simplified, and environmental pollution is avoided. Besides, since two thinner glass substrates are combined to form a relatively thicker mother substrate for subsequent array pattern forming process and color filter pattern forming process, it is possible to avoid the breaking of the thinner glass substrates during the subsequent processes. In addition, the mother substrate provided with the array pattern and the color filter pattern can be easily separated into the array substrate and the counter substrate, which in turn can be bonded together in an expected way to form a liquid crystal panel.

Although the present invention has been described in considerable detail with reference to preferred embodiments thereof, some modifications or improvements may still be made on the basis of the present invention, which is evident to those skilled in the art. Therefore, those modifications or improvements, which are made without departing from the spirit of the present invention, all belong to the protection scope of the present invention.

What is claimed is:

1. A method for manufacturing a liquid crystal panel, comprising the followings steps:
   bonding a first substrate with a second substrate so as to form a mother substrate;
   forming an array pattern on a first substrate side of the mother substrate, the first substrate side being away from the second substrate;
   separating the first substrate and the second substrate of the mother substrate; and
   bonding the separated first substrate and the second substrate so that the array pattern is located between the first and second substrates.

2. The method for manufacturing the liquid crystal panel according to claim 1, wherein, after the step of forming the array pattern on the first substrate side of the mother substrate and before the step of separating the first substrate and the second substrate of the mother substrate, the method further comprises: forming a color filter pattern on the first substrate side or a second substrate side of the mother substrate, the second substrate side being away from the first substrate; bonding the separated first and second substrates in such a way that the color filter pattern and the array pattern are located between the first and second substrates.

3. The method for manufacturing the liquid crystal panel according to claim 2, wherein, after the step of forming the array pattern on the first substrate side of the mother substrate, the mother substrate is flipped so as to form the color filter pattern on the second substrate side of the mother substrate.

4. The method for manufacturing the liquid crystal panel according to claim 3, wherein the mother substrate is flipped in an overall support way.

5. The method for manufacturing the liquid crystal panel according to claim 4, wherein the mother substrate is supported at a non-effective display portion thereof.

6. The method for manufacturing the liquid crystal panel according to claim 2, wherein the color filter pattern on the second substrate side of the mother substrate is cleaned in a non-contact way.

7. The method for manufacturing the liquid crystal panel according to claim 1, wherein, the first and second substrates are bonded together with an adhesive applied on the periphery of any one of the first and second substrates.

8. The method for manufacturing the liquid crystal panel according to claim 7, wherein the adhesive does not contain any fiber-particle.

9. The method for manufacturing the liquid crystal panel according to claim 1, wherein, before the step of separating the first and second substrates of the mother substrate, the method further comprises: forming a first alignment layer and a second alignment layer on the first substrate side and the second substrate side of the mother substrate respectively; and rubbing both the first and the second alignment layers.

10. The method for manufacturing the liquid crystal panel according to claim 9, wherein, the step of bonding the separated first substrate and the second substrate comprises: applying a seal onto the second substrate side of the mother substrate formed with the rubbed second alignment film; flipping the mother substrate; and dropping liquid crystal onto the first substrate side of the mother substrate formed with the rubbed first alignment film.

11. The method for manufacturing the liquid crystal panel according to claim 1, wherein after the step of separating the first substrate and the second substrate of the mother substrate, the method further comprises transferring the separated first substrate and/or the second substrate in an overall support way.

12. The method for manufacturing the liquid crystal panel according to claim 11, wherein the separated first substrate and/or the second substrate are/is supported at a non-effective display portion thereof.

13. The method for manufacturing the liquid crystal panel according to claim 1, wherein the first and second substrates of the mother substrate are separated by an adsorption separation process.

14. The method for manufacturing the liquid crystal panel according to claim 1, wherein the liquid crystal panel has a thickness of no more than 0.5 mm.

15. The method for manufacturing the liquid crystal panel according to claim 1, wherein at least one of the first and second substrates has a thickness of no more than 0.25 mm.

* * * * *